(12) United States Patent
Muhammad

(10) Patent No.: US 9,088,320 B2
(45) Date of Patent: Jul. 21, 2015

(54) TRANSMITTER WITH PRE-DISTORTION MODULE, A METHOD THEREOF

(71) Applicant: Khurram Muhammad, Garland, TX (US)

(72) Inventor: Khurram Muhammad, Garland, TX (US)

(73) Assignee: MSTAR SEMICONDUCTOR, INC., Hsinchu, Hsien (TW)

(*) Notice: Subject to any disclaimer, the term of this patent is extended or adjusted under 35 U.S.C. 154(b) by 85 days.

(21) Appl. No.: 13/688,609

(22) Filed: Nov. 29, 2012

(65) Prior Publication Data

US 2014/0146917 A1 May 29, 2014

(51) Int. Cl.
*H04B 1/04* (2006.01)
*H03F 1/32* (2006.01)

(52) U.S. Cl.
CPC ............ *H04B 1/0475* (2013.01); *H03F 1/3241* (2013.01)

(58) Field of Classification Search
CPC ....... H03F 1/32; H03F 1/3241; H03F 1/3288; H03F 1/3282; H03F 1/3294; H03F 2200/331; H03F 2200/336; H03F 2201/3233; H03F 2201/3212; H03F 2201/32; H04B 2001/0425; H04L 27/368
See application file for complete search history.

(56) References Cited

U.S. PATENT DOCUMENTS

| 7,382,297 | B1* | 6/2008 | Kopikare et al. | 341/118 |
| 2006/0291589 | A1* | 12/2006 | Eliezer et al. | 375/302 |
| 2007/0049219 | A1* | 3/2007 | Demir et al. | 455/126 |
| 2007/0160164 | A1* | 7/2007 | Sahota | 375/295 |
| 2008/0171518 | A1* | 7/2008 | Lorenzen | 455/67.14 |
| 2010/0105338 | A1* | 4/2010 | Wang et al. | 455/73 |
| 2014/0126669 | A1* | 5/2014 | Mahoney et al. | 375/296 |
| 2014/0219391 | A1* | 8/2014 | Mahoney et al. | 375/297 |

OTHER PUBLICATIONS

Viral K. Parikh, Poras T.Balsara and Oren E. Eliezer, "A fully digital architecture for wideband wireless transmitters", University of Texas at Dallas, Texas Instruments, 2008 IEEE.*

* cited by examiner

*Primary Examiner* — Aristocratis Fotakis
(74) *Attorney, Agent, or Firm* — Oliff PLC

(57) ABSTRACT

Aspects of the disclosure provide a transmitter that includes a pre-distortion module and a phase controller. The pre-distortion module is configured to receive a first digital value and generate a first pre-distorted digital value based on the first digital value and a corresponding angle. The first digital value is a combination of an in-phase component and a quadrature component of a signal for transmission. The phase controller is configured to control an amplifier to drive a current according to the first pre-distorted digital value and phase information in relation to the first digital value during a first phase range of a carrier signal determined at least partially based on the angle.

20 Claims, 5 Drawing Sheets

TRANSMITTER WITH PRE-DISTORTION MODULE, A METHOD THEREOF

BACKGROUND

Generally, transmitters can include one or more power amplifiers to deliver a relatively larger amount of power to a load device, such as an antenna. However, such power amplifiers can have non-linear characteristics that can distort signal amplitude and phase, and thus make noise specifications of the transmitters difficult to meet.

SUMMARY

Aspects of the disclosure provide a transmitter that includes a pre-distortion module and a phase controller. The pre-distortion module is configured to receive a first digital value and generate a first pre-distorted digital value based on the first digital value and a corresponding distortion angle. The first digital value is a combination of an in-phase component and a quadrature component of a signal for transmission. The phase controller is configured to control an amplifier to drive a current according to the first pre-distorted digital value and phase information in relation to the first digital value during a first phase range of a carrier signal determined at least partially based on the distortion angle.

Further, the pre-distortion module is configured to receive a second digital value and generate a second pre-distorted digital value based on the second digital value and the distortion angle. The second digital value is a combination of the in-phase component and the quadrature component of the signal for transmission. The phase controller is configured to control the amplifier to drive the current according to the second pre-distorted digital value and phase information in relation to the second digital value during a second phase range of the carrier signal determined at least partially based on the distortion angle. In an embodiment, the transmitter includes a modem configured to generate the first digital value and the second digital value and provide the phase information in relation to the first digital value and the phase information in relation to the second digital value.

According to an aspect of the disclosure, the first digital value is an absolute value of a sum of the in-phase component and the quadrature component, and a second digital value is an absolute value of a difference between the in-phase component and the quadrature component. The pre-distortion module can calculate the first pre-distorted digital value and the second pre-distorted digital value as a function of the first digital value, the second digital value, and the distortion angle.

Additionally, in an embodiment, the pre-distortion module includes a first module configured to compensate for amplitude modulation to amplitude modulation (AMAM) distortion of the amplifier and a second module configured to compensate for amplitude modulation to phase modulation (AMPM) distortion of the amplifier.

Other aspects of the disclosure provide a method that includes generating a first pre-distorted digital value based on a first digital value and a corresponding distortion angle. The first digital signal is a combination of an in-phase component and a quadrature component of a signal for transmission. Further, the method includes controlling an amplifier to drive a current according to the first pre-distorted digital value and phase information in relation to the first digital value in a first phase range of a carrier signal determined at least partially based on the distortion angle.

Further, the method can include generating a second pre-distorted digital value based on a second digital value and the corresponding distortion angle, and controlling the amplifier to drive the current according to the second pre-distorted digital value and the phase information in relation to the second digital value in a second phase range determined at least partially based on the distortion angle. In an exemplary embodiment, the first digital value is an absolute value of a sum of the in-phase component and the quadrature component and the second digital value is an absolute value of a difference of the in-phase component and the quadrature component.

Aspects of the disclosure can also provide an apparatus that includes an amplifier configured to drive a current to a load for transmission, a pre-distortion module configured to generate a first pre-distorted digital value based on a first digital value and a corresponding distortion angle, and a phase controller configured to control the amplifier to drive the current according to the first pre-distorted digital value and phase information in relation to the first digital value during a first phase range determined at least partially based on the distortion angle. The first digital value can be a combination of an in-phase component and a quadrature component of a signal for transmission.

Aspects of the disclosure can also provide a pre-distortion module. The pre-distortion module includes an input interface and a circuit. The input interface is configured to receive a first digital value and a second digital value. The circuit is configured to generate a first pre-distorted digital value and a second pre-distorted digital value based on the first digital value, the second digital value and a corresponding distortion angle. The first digital value is a first combination of an in-phase component and a quadrature component of a signal for transmission, and the second digital value is a second combination of the in-phase component and the quadrature component of the signal for transmission.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
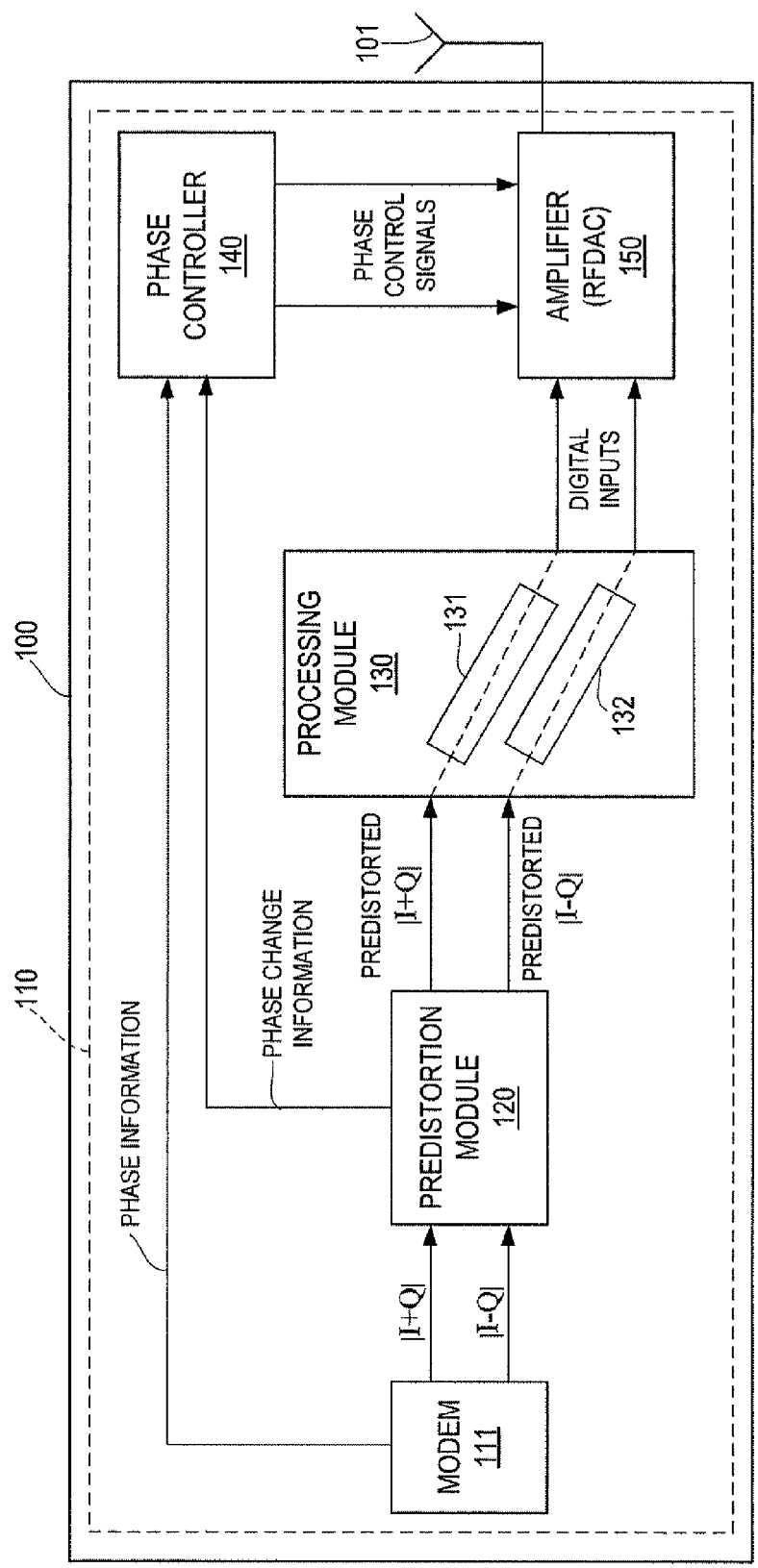
FIG. 1 shows an exemplary block diagram of an electronic device 100 according to an embodiment of the disclosure.

FIG. 1 shows an exemplary block diagram of an electronic device 100 according to an embodiment of the disclosure. The electronic device 100 can be any device that communicates wirelessly to send or receive data, and includes a transmitter 110 that is based on a digital quadrature modulator architecture. As shown in FIG. 1, the transmitter 110 includes a modem 111, a pre-distortion module 120, a processing module 130, a phase controller 140 and an amplifier 150. These elements can be coupled together as shown in FIG. 1.

As shown in FIG. 1, the amplifier 150 is a digital power amplifier that provides a driving current to a load device, such as an antenna 101, according to digital inputs to the amplifier 150. In an embodiment, the amplifier 150 is a radio frequency digital to analog converter (RFDAC) 150 that combines an RF mixer and a power amplifier drive in one stage.

In an embodiment, the RFDAC 150 receives digital inputs that lack complete phase information, such as lack quadrant information, of the data for transmission, and receives phase control signals, such as quadrant control signals, generated based on an RF carrier and the phase information of the data for transmission. Hence, in an example, the digital inputs provide partial phase information, and the remaining phase information (e.g., quadrant information) is provided through the phase controller 140. Then, the RFDAC 150 varies a driving current to the antenna 101 within an RF cycle of the RF carrier at phases controlled by the phase control signals and with a driving current of which amplitude is controlled by the digital inputs. Thus, the RFDAC 150 mixes the data for transmission with the RF carrier, and delivers power accordingly to the antenna 101.

According to an aspect of the disclosure, the impedance of the RFDAC 150 depends on the digital inputs. The non-constant impedance can cause an amplifier gain to not remain constant across all inputs and thus the RFDAC 150 does not have perfect linearity. The non-linearity of the RFDAC 150 can cause amplitude modulation to amplitude modulation (AMAM) distortion, and amplitude modulation to phase modulation (AMPM) distortion, and can generally degrade the overall performance of the electronic device 100.

To improve the performance of the electronic device 100, in the present disclosure, the digital inputs are pre-distorted to compensate for the AMAM distortion and the AMPM distortion. The AMPM pre-distortion also generates updates in the phase control signals generated from the phase controller 140. Then, the RFDAC 150 varies the driving current within an RF cycle at phases controlled by the updated phase control signals and with driving current of which amplitude is controlled by the pre-distorted digital inputs. The pre-distortion compensates for the AMAM distortion and the AMPM distortion of the RFDAC 150, thus the output of the RFDAC 150 achieves better linear relationship to the data for transmission.

According to an aspect of the disclosure, because the transmitter 110 has a digital quadrature modulator architecture (i.e., the digital inputs to the RFDAC 150 are generated based on Cartesian modulation), therefore the pre-distortion is performed on data generated based on Cartesian modulation. In a digital quadrature modulator embodiment, the absolute values of Cartesian modulation signals are interleaved before applying to the RFDAC 150. The quadrant of the constellation point transmitted is controlled by the phase controller 140.

In the FIG. 1 example, the modem 111 can generate baseband data for transmission, such as voice data, video data, and the like, in a Cartesian system. Then, the pre-distortion module 120 can pre-distort the generated data in the Cartesian system. The processing module 130 can further process the pre-distorted data to generate the pre-distorted digital inputs for the RFDAC 150. The phase controller 140 provides the phase control signals to the RFDAC 150 based on the phase information of the baseband data and the phase change information due to pre-distortion. Then, the RFDAC 150 generates the driving current to the antenna 101 based on the pre-distorted digital inputs and the phase control signals.

Specifically, in an embodiment, the modem 111 can convert baseband data for transmission into digital samples of in-phase component (I) and digital samples of quadrature component (Q). Then, the modem 111 provides absolute values of I+Q (|I+Q|), and absolute values of I−Q (|I−Q|) to downstream modules, such as the pre-distortion module 120, the processing module 130, and amplifier 150, and the like for transmission. In addition, the modem 111 provides the phase information of the data for transmission to the phase controller 140.

The pre-distortion module 120 receives |I+Q| and |I−Q|, pre-distorts |I+Q| and |I−Q| to compensate for non-linearity in the amplifier 150, and provides pre-distorted |I+Q| and |I−Q| to the processing module 130. In addition, the pre-distortion module 120 provides phase change information due to pre-distortion to the phase controller 140.

The processing module 130 includes a first processing path 131 and a second processing path 132 to respectively process the pre-distorted |I+Q| and |I−Q|, generate the digital inputs corresponding to the pre-distorted |I+Q| and |I−Q|, and provide the digital inputs to the RFDAC 150.

The phase controller 140 receives the phase information of data for transmission, such as a polar angle of (I, Q), signs of I and Q, and the like, and also receives the phase change information due to the pre-distortion. The phase controller 140 then generates the phase control signals based on the phase information and the phase change information, and provides the phase control signals to the RFDAC 150.

The RFDAC 150 then varies the driving current to the antenna 101 within an RF cycle of the RF carrier at phases controlled by the phase control signals and with a driving current amplitude controlled by the digital inputs corresponding to the pre-distorted |I+Q| and |I−Q|.

It is noted that transmitter 110 in FIG. 1 can be suitably modified. In an example, the modem 111 provides I and Q, respectively, to the pre-distortion module 120. The pre-distortion module 120 performs pre-distortion on I and Q, and calculates to generate the pre-distorted |I+Q| and |I−Q| based on the pre-distorted I and Q. The generated pre-distorted |I+Q| and |I−Q| are then provided to the processing module 130 for subsequent processing. In another example, the modem 111 provides I+Q and I−Q respectively to the pre-distortion module 120. The pre-distortion module 120 performs pre-distortion on I+Q and I−Q, calculates pre-distorted |I+Q| and |I−Q| based on the pre-distorted I+Q and I−Q. The pre-distorted |I+Q| and |I−Q| are then provided to the processing module 130 for subsequent processing.

According to an embodiment of the disclosure, the various components of the transmitter 110 can be implemented as a circuit integrated on one or more integrated circuit (IC) chips. In an embodiment, the modem 111 and the pre-distortion module 120 are implemented on a same IC chip. In another embodiment, the modem 111 and the pre-distortion module 120 are implemented on different IC chips. Thus, in an example, the pre-distortion module 120 includes an input interface configured to receive data provided by the modem 111. The modem 111 may be implemented on a different IC chip. The pre-distortion module 120 further includes a circuit to perform pre-distortion on the received data.

Figure 2:
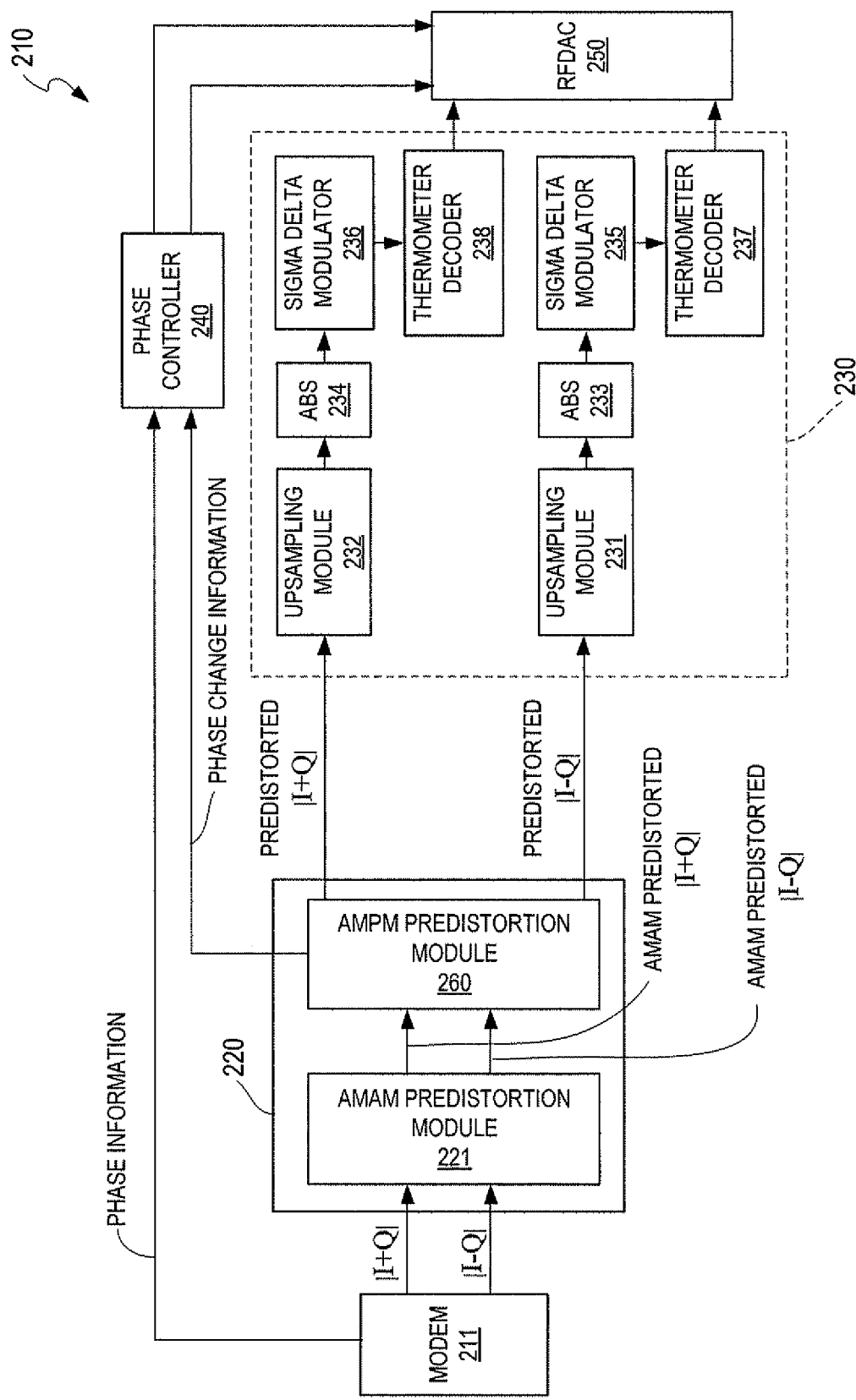
FIG. 2 shows an exemplary block diagram of a transmitter 210 according to an embodiment of the disclosure.

FIG. 2 shows an exemplary block diagram of a transmitter 210 according to an embodiment of the disclosure. The transmitter 210 can include a modem 211, a pre-distortion module 220, a processing module 230, a phase controller 240, and an RFDAC 250. These elements can be coupled together as shown in FIG. 2.

In this embodiment, the pre-distortion module 220 can include an AMAM pre-distortion module 221 and an AMPM pre-distortion module 260. The processing module 230 can include up-sampling modules 231 and 232, absolute modules (ABS) 234 and 233, sigma-delta modulators 235 and 236, and thermometer decoders 237 and 238. Again, these elements can be coupled together as shown in FIG. 2.

In operation, the modem 211 can convert baseband data for transmission into digital samples of an in-phase component (I) and digital samples of a quadrature component (Q). The modem 211 can also calculate absolute values of I+Q (|I+Q|), and absolute values of I−Q (|I−Q|). The digital values of |I+Q| and |I−Q| can then be supplied to downstream modules for further processing. In addition, the modem 211 can provide phase information of the data, such as the signs of I and Q, a polar angle of (I, Q), and the like, to the phase controller 240.

The pre-distortion module 220 receives digital values for |I+Q| and |I−Q| and performs pre-distortion based on the digital values for |I+Q| and |I−Q|. According to an aspect of the disclosure, the RFDAC 250 can be calibrated to determine its AMAM distortion characteristics and AMPM distortion characteristics. Then, based on the AMAM distortion characteristics, AMAM pre-distortion can be determined to compensate for the AMAM distortion. Likewise, based on the AMPM distortion characteristics, AMPM pre-distortion can be determined to compensate for the AMPM distortion.

In an example, the AMAM pre-distortion module 221 can include a look-up table that associates an AMAM pre-distorted value with an input value. Based on the look-up table, the AMAM pre-distortion module 221 generates AMAM pre-distorted values for |I+Q| and |I−Q|.

Further, the AMPM pre-distortion module 260 may also include a look-up table that associates an AMPM distortion angle with an amplitude of data for transmission. Based on the digital values for |I+Q| and |I−Q|, the AMPM pre-distortion module 260 can determine the amplitude of the data for transmission, and then determine the AMPM distortion angle based on the look-up table. Subsequently, the AMPM pre-distortion module 260 can calculate digital values that rotate |I+Q| and |I−Q| to compensate for the AMPM distortion angle. It is noted that the calculated digital values can be negative due to rotation.

According to an aspect of the disclosure, the AMPM pre-distortion changes phase information of the data for transmission, and thus the phase change information is provided to the phase controller 240. In an example, the signs of the pre-distorted |I+Q| and |I−Q| are provided to the phase controller 240. In another example, the AMPM distortion angle is provided to the phase controller 240.

The processing module 230 forms two paths to respectively process the pre-distorted values for |I+Q| and |I−Q|. A first processing path can include the up-sampling module 231, the absolute module 233, the sigma-delta modulator 235 and the thermometer decoder 237 to process the pre-distorted values for |I−Q|. A second processing path can include the up-sampling module 232, the absolute module 234, the sigma-delta modulator 236, and the thermometer decoder 238 to process the pre-distorted values for |I+Q|.

In the first processing path, the up-sampling module 231 can up-sample the pre-distorted values of the baseband data to higher rate, such as an RF carrier signal rate and the like. The up-sampling module 232 can use any suitable interpolation algorithm to up-sample the baseband data. Further, the up-sampling module 231 can be configured to preform digital filtering on the up-sampled data. In an embodiment, the up-sampling module 231 is implemented as a multi-stage digital filter.

The absolute module 233 calculates the absolute values for the up-sampled values. The sigma-delta modulator 235 is configured to increase the resolution of digital values for |I−Q|. In one embodiment, the absolute values are fixed-point digital signals that have K+L bits, where K bits are used for integer resolution, and L bits are used for fractional resolution. The sigma-delta modulator 235 provides the integer part to the thermometer decoder 237, accumulates the fractional part into a low frequency integer, and then suitably adds the low frequency integer to the integer part.

Figure 4:
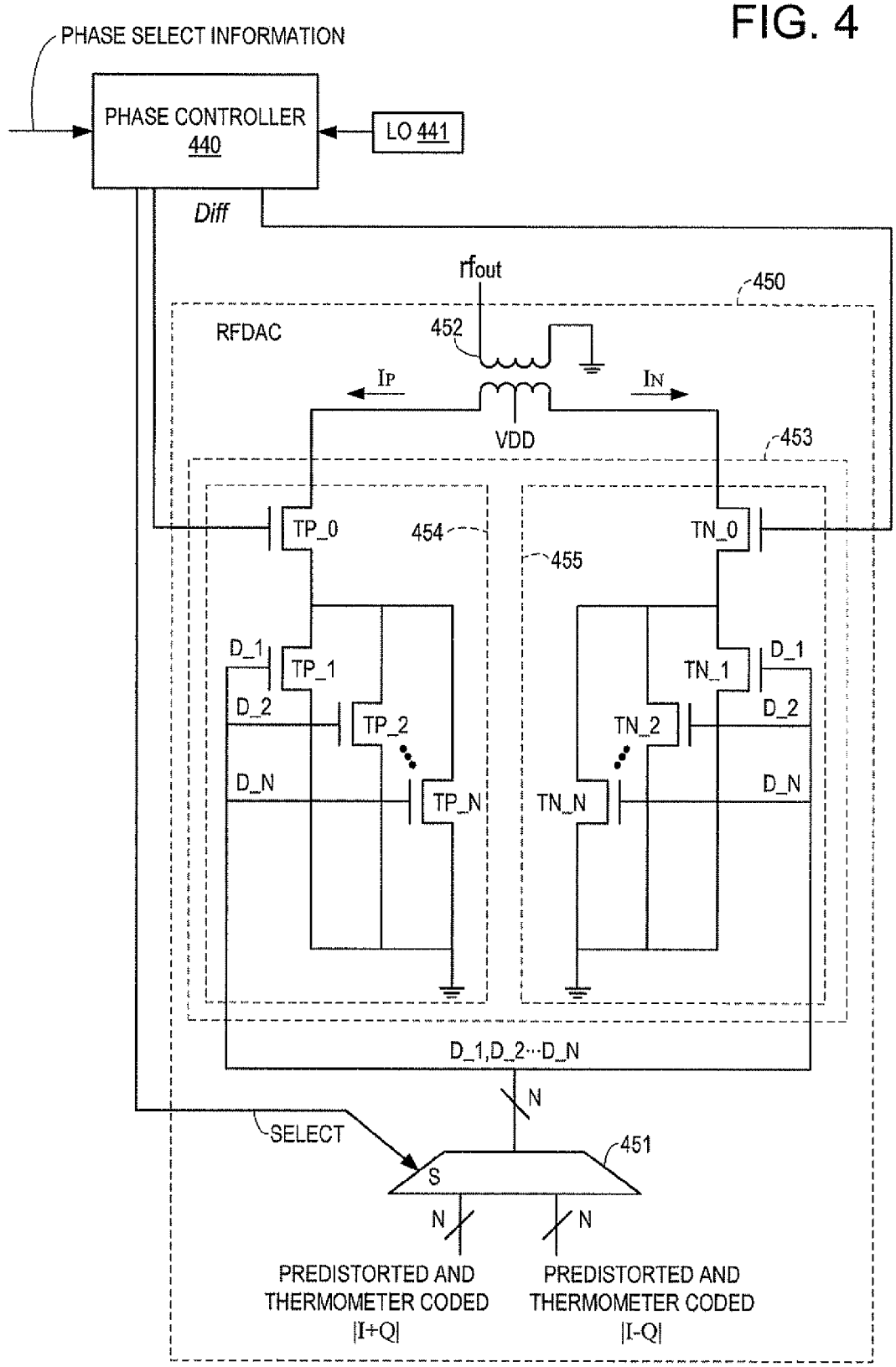
FIG. 4 shows an exemplary diagram of an amplifier 450 according to an embodiment of the disclosure.

The thermometer decoder 237 converts the integer signal into a suitable form for controlling the RFDAC 250. An embodiment of RFDAC 250 is shown in FIG. 4 and is described in detail below. In the embodiment, the RFDAC 250 includes a plurality of switchable current paths of about the same current to drive a load. When a switch signal to a current path is "1", the current path is switched on to drive the load; and when the switch signal is "0", the current path is switched off to be decoupled from the load. In this example, the thermometer decoder 237 converts, for example, binary "0101" to "000000000011111" to turn on five current paths. It is noted that other encoders or decoders are possible.

The second processing path operates similarly to the first processing path as described above.

The phase controller 240 determines the phase control signals to the RFDAC 250 based on the phase information provided by the modem 211 and the phase change information provided by the pre-distortion module 220. The phase control signals control the RFDAC 250 to generate the driving current according to suitable values of |I−Q|, |I+Q|, −|I−Q|, and −|I+Q| at suitable phases within a cycle of an RF carrier signal to mix the data with the RF carrier signal.

In an example, the phase controller 240 can determine the phase control signals based on a quadrant of pre-distorted (I, Q). For example, when the pre-distorted (I, Q) is in the first quadrant, the driving current of the RFDAC 250 is controlled by |I−Q| in [0°, 90°], by |I+Q| in [90°, 180°], by −|I−Q| in [180°, 270°], and by −|I+Q| in [270°, 360°] of an RF carrier signal. Alternatively, when (I, Q) is in the third quadrant, the driving current of the RFDAC 250 is controlled by −|I−Q| in [0°, 90°], by −|I+Q| in [90°, 180°], by |I−Q| in [180°, 270°], and by |I+Q| in [270°, 360°] of the RF carrier signal. The driving current of the RFDAC 250 can be similarly controlled when the pre-distorted (I, Q) in the second quadrant and the fourth quadrant.

It is noted that phase controller 240 can determine the phase control signals by any suitable technique. In an embodiment, the phase controller 240 determines the phase control signals to control the RFDAC 250 based on a combination of the quadrant of (I, Q), and a comparison of the absolute values of I and Q.

It is noted the transmitter 210 can be suitably modified. In an example, the up-sampling modules 231 and 232 may switch positions with the absolute modules 233 and 234. In another example, the modem 211 is not part of the transmitter 210, but can be suitably coupled with the pre-distortion module 220 and the phase controller 240.

Figure 3:
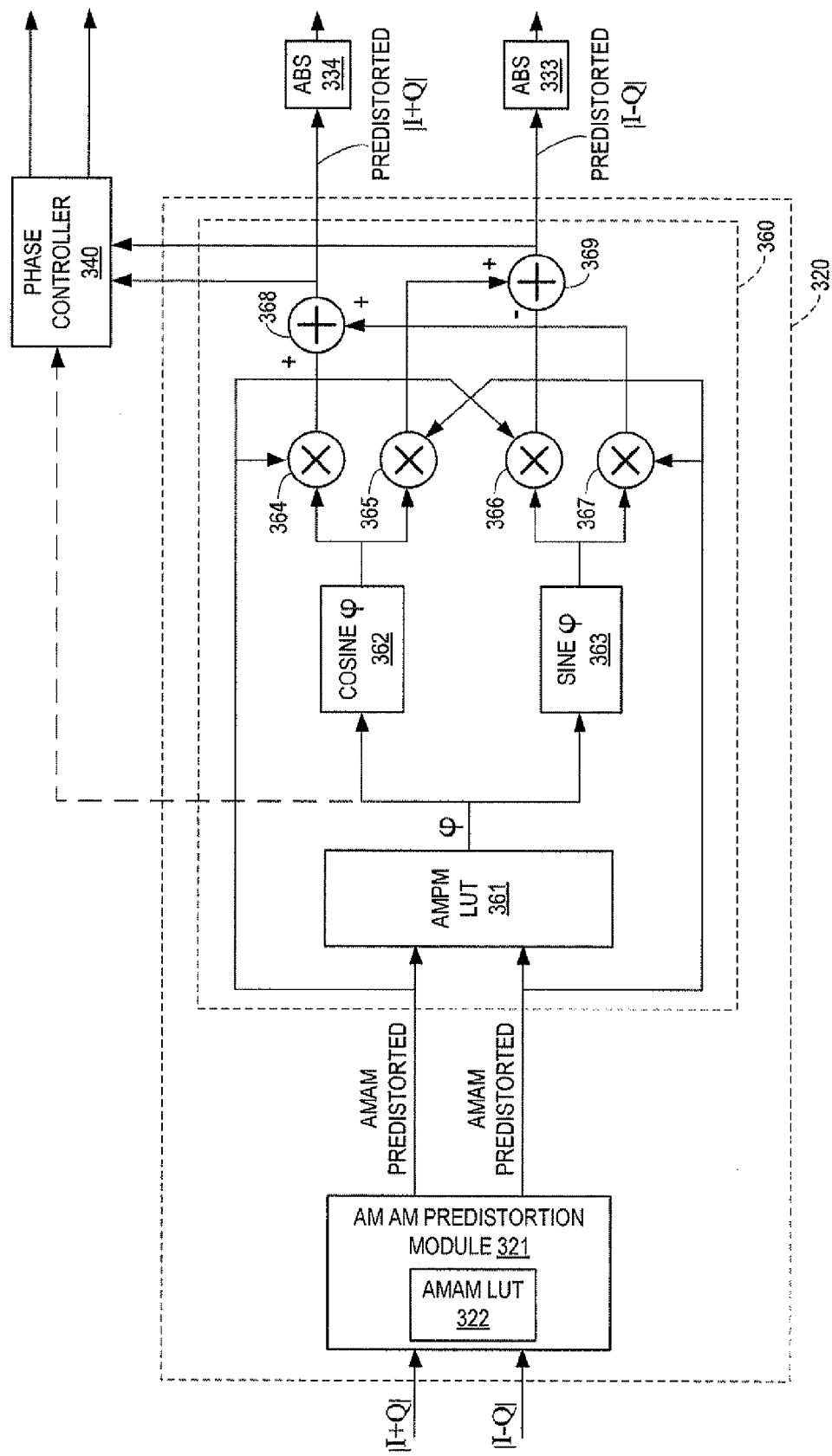
FIG. 3 shows an exemplary diagram of a pre-distortion module 320 according to an embodiment of the disclosure.

FIG. 3 shows an exemplary diagram of a pre-distortion module 320 according to an embodiment of the disclosure. The pre-distortion module 320 includes an AMAM pre-distortion module 321 and an AMPM pre-distortion module 360. The pre-distortion module 320 receives |I−Q| and |I+Q|, performs pre-distortion on |I−Q| and |I+Q|, and generates pre-distorted |I−Q| and pre-distorted |I+Q|.

In FIG. 3, the AMAM pre-distortion module 321 includes a look-up table 322 that associates an AMAM pre-distorted value with an input digital value. Based on the look-up table, the AMAM pre-distortion module 321 generates AMAM pre-distorted values for |I+Q| and |I−Q|.

In other embodiment, the look-up table 322 can store the AMAM pre-distortion data in other forms. In an example, the look-up table 322 can associate an AMAM pre-distortion ratio with an amplitude of data for transmission. Based on |I+Q| and |I−Q|, the AMAM pre-distortion module 321 can calculate the amplitude of data for transmission. Then, the AMAM pre-distortion module 321 determines the AMAM pre-distortion ratio based on the look-up table 322, and uses the ratio to calculate the AMAM pre-distorted values for |I+Q| and |I−Q|.

In FIG. 3 example, the AMPM pre-distortion module 360 also includes a look-up table 361. For example, the look-up table 361 associates an AMPM distortion angle with an amplitude of data for transmission. Based on the AMAM pre-distorted digital values for |I+Q| and |I−Q|, the AMPM pre-distortion module 360 can calculate the amplitude of data for transmission, and find the associated AMPM distortion angle in the look-up table 361. The AMPM pre-distortion module 360 then calculates pre-distorted values for |I+Q| and |I−Q| to compensate for the AMPM distortion angle.

It is noted that the calculated digital values can be negative due to AMPM pre-distortion. The pre-distorted values can be further processed. For example, absolute modules (ABS) 334 and 333 can calculate absolute values of the pre-distorted |I+Q| and |I−Q|.

In the FIG. 3, the AMPM pre-distortion module 360 calculates the pre-distorted values according to Eq. 1 and Eq. 2:

$$A_{PRE\text{-}DIST} = A' \times \cos\phi + B' \times \sin\phi \qquad \text{Eq. 1}$$

$$B_{PRE\text{-}DIST} = B' \times \cos\phi - A' \times \sin\phi \qquad \text{Eq. 2,}$$

where $A_{PRE\text{-}DIST}$ denotes pre-distorted |I−Q|, $B_{PRE\text{-}DIST}$ denotes pre-distorted |I+Q|, A' denotes AMAM pre-distorted |I−Q|, B' denotes AMAM pre-distorted |I+Q|, and $\phi$ denotes the AMPM distortion angle.

Specifically, the AMPM pre-distortion module 360 includes a cosine module 362, a sine module 363, multiplication modules 364-367 and adders 368 and 369. These elements are coupled together as shown in FIG. 3 to calculate the pre-distorted values.

The modules 362-369 can be implemented by various techniques. In an example, a module can be implemented as software instructions to be executed by a processor. In another example, a module can be implemented as a circuit. For example, the sine module 363 and the cosine module 364 can be implemented as instruction codes to be executed by a processor, or can be implemented as memories storing pre-calculated sine and cosine values.

In the FIG. 3, the AMPM pre-distortion module 360 can provide the AMPM distortion angle $\phi$ to the phase controller 340 or can provide signs of the pre-distorted values for |I+Q| and |I−Q| to the phase controller 340 as the phase change information.

It should be understood that while look-up tables 322 and 361 are used in the embodiment in FIG. 3, other suitable techniques, such as equations, algorithms, and the like, can be used to perform the same functions as the look-up tables 322.

It is also noted that Eq. 1 and Eq. 2 are also applicable to AMPM pre-distortion of I+Q and I−Q. Thus, the pre-distortion module 320 can also be used for pre-distortion of I+Q and I−Q. In addition, the pre-distortion module 320 can be suitably changed to perform pre-distortion on other digital quadrature based data format, such as I and Q, |I| and |Q|, and the like.

It is also noted that AMPM modification can cause slight change to the amplitude of pre-distorted AMAM values. It is experienced that the relative shift applied as AMPM compensation is small and as a result the change in pre-distorted AMAM values is also quite small. As an example, in the higher output power ranges, AMPM compensation needed by a PA is less than 5 degrees. Rotation by less than 5 degrees only slightly modifies the AMAM values.

It is also noted that in a different embodiment, a two-dimensional lookup table (LUT) may be used in place of the combined AMAM/AMPM module 220 shown in FIG. 2. The two-dimensional table can be used to store AMAM and AMPM compensations for all I, Q combinations. The implementation complexity of the two-dimensional pre-distortion table may also be reduced by storing a reduced set of AMAM and AMPM compensation values for some I,Q pairs, whereas the values falling between the stored values may be obtained using an interpolation scheme, such as linear or polynomial interpolation, and the like. The LUT can store the AMAM compensation, the AMPM compensation and the phase change information. Note that the scheme shown in FIG. 2 and FIG. 3 are low-complexity implementations that avoid a bulky two-dimensional pre-distortion LUT.

FIG. 4 shows an exemplary diagram of an amplifier 450 according to an embodiment of the disclosure. The amplifier 450 can be used as the RFDAC 250 in FIG. 2. The amplifier 450 includes a multiplexer 451, a load device 452, and a differential converter 453. The amplifier 450 is controlled by a phase controller 440 that provides phase control signals, such as a select signal and a pair of differential signals (Diff), and the like to the amplifier 450.

The multiplexer 451 receives the select signal from the phase controller 440 to select one of pre-distorted and thermometer coded |I+Q| and pre-distorted and thermometer coded |I−Q| to control a driving current generated by the differential converter 453. The multiplexer alternates |I−Q| and |I+Q| signals as these are applied to the RFDAC input.

The load device 452 is configured to transmit a signal $rf_{out}$ based on a driving current provided by the differential converter 453.

The differential converter 453 includes a positive portion 454 and a negative portion 455. In the FIG. 4 example, the positive portion 454 includes a transistor TP_0 to gate the positive portion 454, and a plurality of transistors TP_1 to TP_N to switch on/off current paths based on the output of the multiplexer 451. Similarly, the negative portion 455 includes a transistor TN_0 to gate the negative portion 455, and a plurality of transistors TN_1 to TN_N to switch on/off current paths based on the output of the multiplexer 451. The positive portion 454 causes a current to flow in the output load in one direction. The negative portion 455 causes the current to flow in the load in the opposite direction. With one side turned on, 3 dB less power is generated, however, one side operation can also create the modulated output.

In the FIG. 4 example, the phase controller 440 provides the differential signals Diff to the transistors TP_0 and TN_0 to control the differential converter 453 to drive the load device 452 by the positive portion 454 or drive the load device 452 by the negative portion 455. In an embodiment, the phase controller 440 receives phase signals provided by a local oscillator (LO 441), such as four phase signals corresponding to 0-degree LO signal, 90-degree LO signal, 180-degree LO signal and 270-degree LO signal. The differential signals can be selected from one of the four phase signals of the LO 441 by the phase controller 440 based on the quadrant which the output signal is within. For example, in case the differential signals Diff are selected of the 0-degree LO signal from the LO 441 (first quadrant), the differential signals Diff can turn on the transistor TP_0 and turn off the transistor TN_0 to drive the load device 452 by the positive portion 454 with a current $I_P$ in phase with the 0-degree LO signal. Similarly, in case the differential signals Diff are selected of the 180-degree LO signal from the LO 441 (third quadrant), the differential signals Diff can turn off the transistor TP_0 and turn on the transistor TN_0 to drive the load device 452 by the negative portion 455 with a current $I_N$ that is in phase with the 180 degree LO signal. Hence, the differential signals Diff cause the up-conversion to RF in the quadrant according to the selected LO phase signal.

The differential signals Diff and the select signal collectively control the amplifier 450 to generate the driving current to the load device 452 according to suitable digital values in suitable phase ranges in an RF cycle to mix the data with the RF carrier signal.

In one embodiment, assume (I, Q) is in the first quadrant. In [0, 90°] of an RF cycle, the phase controller 440 provides the select signal to select the pre-distorted thermometer coded values of alternating |I−Q|, |I+Q|, |I−Q|, |I+Q|, ..., and so on, selects the Diff signal to be the 0/180 degree LO signal and provides the differential signals Diff to drive the load device 452 by the positive portion 454 during 0 degree LO cycle and negative portion 455 to drive the load device 452 during the positive cycle of 180 degree LO signal, thus the driving current of the load device 452 is controlled by the alternating data |I−Q|, |I+Q|, ..., whereas the quadrant is selected by the phase of the LO selected through the phase controller.

In [90°, 180°] of the RF cycle, the phase controller 440 provides the select signal to select the pre-distorted thermometer coded values of interleaved sequence |I−Q|, |I+Q|, ..., so on, selects the Diff signal to be the 90/270 degree LO signal, and provides the differential signals Diff to drive the load device 452 by the positive portion 454 during the 90 degree LO cycle and negative portion 455 to drive the load device 452 during the positive cycle of 270 degree LO signal, thus the driving current of the load device 452 is controlled by the alternating data |I−Q|, |I+Q|, ..., so on.

In [180°, 270°] of the RF cycle, the phase controller 440 provides the select signal to select the pre-distorted thermometer coded values of alternating sequence |I−Q|, |I+Q|, ..., so on, selects the Diff signal to be 180/90 degree LO signal, and provides the differential signals Diff to drive the load device 452 by the positive portion 454 during the 180 degree LO cycle and negative portion 455 to drive the load device 452 during the positive cycle of 0 degree LO, thus the driving current of the load device 452 is controlled by the alternating data |I−Q|, |I+Q|, ..., so on.

In [270°, 360°] of the RF cycle, the phase controller 440 provides the select signal to select the pre-distorted thermometer coded values of alternating sequence |I−Q|, |I+Q|, ..., so on, selects the Diff signal to be the 270/90 degree LO signal, and provides the differential signals Diff to drive the load device 452 by the positive portion 454 during the 270 degree LO cycle and negative portion 455 to drive the load device 452 during the positive cycle of 90 degree LO, thus the driving current of the load device 452 is controlled by the alternating data |I−Q|, |I+Q|, ..., so on. Note that the sequence |I−Q|, |I+Q| can control the output phase between 0 and 90 degrees. The coarse stepping of quadrant (phase stepping in 90 degree steps) is performed using the phase controller 440.

It is noted that the phase controller 440 can use any suitable technique to generate the phase control signals to the amplifier 450. In an embodiment, the LO 441 generates an oscillation signal. In an example, the frequency of the oscillation signal is twice of the RF carrier frequency. Based on the oscillation signal, a clock signal is generated. Further, the phase controller 440 receives phase select information that can include phase information of the in-phase component and the quadrature component of the data for transmission and phase change information due to the AMPM pre-distortion.

Based on the phase information and the phase change information, the phase controller 440 provides the phase control signals to the amplifier 450 in response to transition edges of the clock signal in an example. In another embodiment, the phase controller 440 may receive the four LO phase signals from a phase locked loop (PLL) and include logics to select the appropriate LO phase signal to be transmitted.

It is noted that the transistors TP_0 to TP_N and TN_0 and TN_N can be any type of transistors, such as bipolar transistors, metal-oxide-semiconductor field effect transistors and the like. In addition, the amplifier 150 can be suitably modified. In an example, a current mirror circuit can be added to provide substantially the same current in each of the current paths. In another example, the functions of the transistors TP_0 and TN_0 can be replaced by logic AND of a corresponding one of the differential signals Diff with the output of the multiplexer 451.

Figure 5:
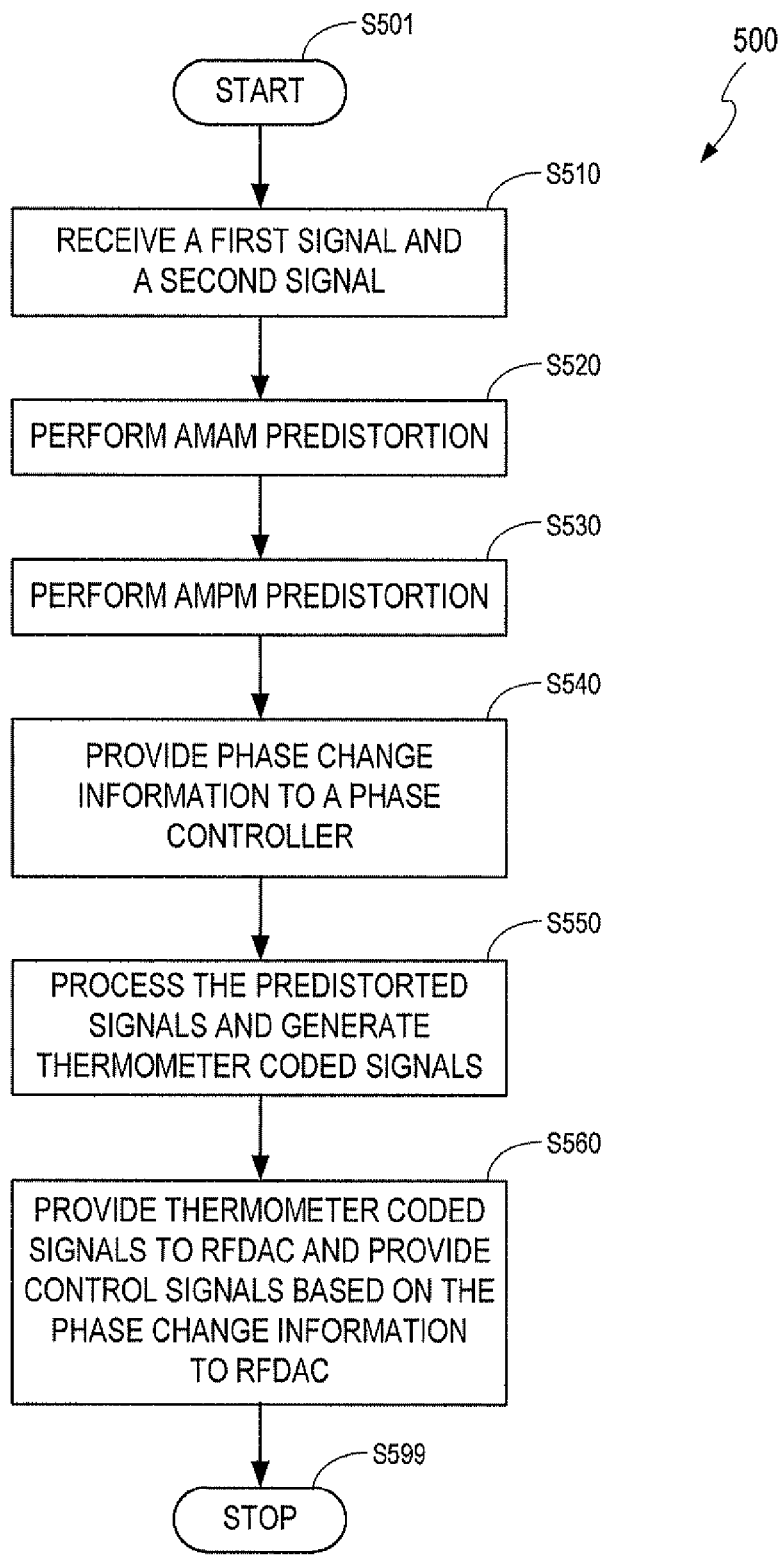
FIG. 5 shows a flowchart outlining an exemplary process 500 according to an embodiment of the disclosure.

FIG. 5 shows a flowchart outlining an exemplary process 500 executed in the transmitter 210 according to an embodiment of the disclosure. The process starts at S501 and proceeds to S510.

At S510, the pre-distortion module 220 receives a first signal and a second signal. The first signal includes digital values for |I−Q|, and the second signal includes digital values for |I+Q|.

At S520, AMAM pre-distortion are performed on the first signal and the second signal. As described above, the AMAM pre-distortion can be performed by the AMAM pre-distortion module 221. In an embodiment, AMAM pre-distortion module 221 can include a look-up table to generate AMAM pre-distorted digital values based on the received digital values.

At S530, the AMPM pre-distortion is performed. AMPM pre-distortion can be performed by the AMPM pre-distortion module 260 that can use a look-up table to determine an AMPM distortion angle. The AMPM pre-distortion module 260 calculates the pre-distorted values for |I−Q| and |I+Q| to compensate for the AMPM distortion angle.

At S540, phase change information due to the AMPM pre-distortion is provided to the phase controller 240. In an embodiment, the AMPM pre-distortion module 260 provides the AMPM distortion angle to the phase controller 240. In another embodiment, the AMPM pre-distortion module 260 provides signs of the AMPM distorted values to the phase controller 240

At S550, the processing module 230 further processes the pre-distorted signals to convert the signals into a suitable form, such as thermometer coded form, for inputting to the RFDAC 250.

At S560, the processing module 230 provides the pre-distorted thermometer coded digital signals to the RFDAC 250. In addition, the phase controller 240 can update the phase control signals based on the phase change information, and provide the updated phase control signals to the RFDAC 250. Thus, the RFDAC 250 generates the driving current to the load device based on the pre-distorted thermometer coded digital signals and the updated phase control signals. The process then proceeds to S599 and terminates.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A transmitter comprising:
   a pre-distortion module configured to (i) receive a first digital value, and generate a first pre-distorted digital value based on the first digital value and a corresponding distortion angle, the first digital value being a first combination of an in-phase component and a quadrature component of a signal for transmission, and (ii) receive a second digital value, and generate a second pre-distorted digital value based on the second digital value and the corresponding distortion angle, the second digital value being a second combination of the in-phase component and the quadrature component of the signal for transmission; and
   a phase controller, coupled to the pre-distortion module and an amplifier, configured to (a) control the amplifier to drive a current according to the first pre-distorted digital value and phase information in relation to the first digital value, during a first phase range of a carrier signal determined at least partially based on the corresponding distortion angle, and (b) control the amplifier to drive the current according to the second pre-distorted digital value and phase information in relation to the second digital value, during a second phase range of the carrier signal determined at least partially based on the corresponding distortion angle.

2. The transmitter of claim 1, wherein the first digital value is an absolute value of a sum of the in-phase component and the quadrature component, and the second digital value is an absolute value of a difference between the in-phase component and the quadrature component.

3. The transmitter of claim 1, further comprising:
   a modem configured to generate the first digital value and the second digital value and provide the phase information in relation to the first digital value and the phase information in relation to the second digital value.

4. The transmitter of claim 2, wherein the pre-distortion module is configured to calculate the first pre-distorted digital value and the second pre-distorted digital value as a function of the first digital value, the second digital value, and the corresponding distortion angle.

5. The transmitter of claim 1, wherein the first phase range and the second phase range are within a radio frequency (RF) cycle.

6. The transmitter of claim 1, wherein the pre-distortion module is configured to determine the corresponding distortion angle based on a look-up table.

7. The transmitter of claim 1, wherein the pre-distortion module further comprises:
   a first module configured to compensate for amplitude modulation to amplitude modulation (AMAM) distortion of the amplifier; and
   a second module configured to compensate for amplitude modulation to phase modulation (AMPM) distortion of the amplifier.

8. The transmitter of claim 7, wherein the amplifier is a radio frequency digital to analog converter (RFDAC).

9. A method comprising:
   receiving a first digital value that is a first combination of an in-phase component and a quadrature component of a signal for transmission;
   generating a first pre-distorted digital value based on the first digital value and a corresponding distortion angle;
   receiving a second digital value that is a second combination of the in-phase component and the quadrature component of the signal for transmission;
   generating a second pre-distorted digital value based on the second digital value and the corresponding distortion angle; and
   controlling an amplifier (a) to drive a current according to the first pre-distorted digital value and phase information in relation to the first digital value in a first phase range of a carrier signal determined at least partially based on the corresponding distortion angle, and (b) to drive the current according to the second pre-distorted digital value and phase information in relation to the second digital value in a second phase range of the carrier signal determined at least partially based on the corresponding distortion angle.

10. The method of claim 9, wherein the first digital value is an absolute value of a sum of the in-phase component and the quadrature component and the second digital value is an absolute value of a difference of the in-phase component and the quadrature component.

11. The method of claim 9, where the first phase range and the second phase range are within a radio frequency (RF) cycle.

12. The method of claim 10, further comprising:
    calculating the first pre-distorted digital value as a function of the first digital value, the second digital value and the corresponding distortion angle; and
    calculating the second pre-distorted digital value as a function of the first digital value, the second digital value and the corresponding distortion angle.

13. The method of claim 9, further comprising:
    determining the corresponding distortion angle based on a look-up table.

14. A wireless communication apparatus comprising:
    an amplifier configured to drive a current to a load for transmission;
    a pre-distortion module configured to (i) receive a first digital value and generate a first pre-distorted digital value based on the first digital value and a corresponding distortion angle, the first digital value being a first combination of an in-phase component and a quadrature component of a signal for transmission, and (ii) receive a second digital value and generate a second pre-distorted digital value based on the second digital value and the corresponding distortion angle, the second digital value being a second combination of the in-phase component and the quadrature component of the signal for transmission; and
    a phase controller configured to (a) control the amplifier to drive the current according to the first pre-distorted digital value and phase information in relation to the first digital value, during a first phase range of a carrier signal determined at least partially based on the corresponding distortion angle, and (b) control the amplifier to drive the current according to the second pre-distorted digital value and phase information in relation to the second digital value, during a second phase range of the carrier signal determined at least partially based on the corresponding distortion angle.

15. The wireless communication apparatus of claim 14, wherein the first digital value is an absolute value of a sum of the in-phase component and the quadrature component, and the second digital value is an absolute value of a difference between the in-phase component and the quadrature component.

16. The wireless communication apparatus of claim 14, further comprising:
    a modem configured to generate the first digital value and the second digital value and provide the phase information in relation to the first digital value and the phase information in relation to the second digital value.

17. The wireless communication apparatus of claim 15, wherein the pre-distortion module is configured to calculate the first pre-distorted digital value and the second pre-distorted digital value as a function of the first digital value, the second digital value, and the corresponding distortion angle.

18. A system including a pre-distortion module coupled to a phase controller and an amplifier,
the pre-distortion module comprising:
an input interface configured to receive a first digital value and a second digital value; and
a circuit that is configured to generate a first pre-distorted digital value and a second pre-distorted digital value based on the first digital value, the second digital value and a corresponding distortion angle, wherein the first digital value is a first combination of an in-phase component and a quadrature component of a signal for transmission, and the second digital value is a second combination of the in-phase component and the quadrature component of the signal for transmission,
wherein the phase controller is configured to:
control the amplifier to drive a current according to the first pre-distorted digital value and phase information in relation to the first digital value, during a first phase range of a carrier signal determined based on the corresponding distortion angle; and
control the amplifier to drive the current according to the second pre-distorted digital value and phase information in relation to the second digital value, during a second phase range of the carrier signal determined based on the corresponding distortion angle.

19. The system of claim 18, wherein the first digital value is an absolute value of a sum of the in-phase component and the quadrature component, and the second digital value is an absolute value of a difference between the in-phase component and the quadrature component.

20. The system of claim 18, wherein the first pre-distorted digital value and the second pre-distorted digital value are generated based on following equations:

$$A_{PRE-DIST} = A' \times \cos \phi + B' \times \sin \phi$$

$$B_{PRE-DIST} = B' \times \cos \phi - A' \times \sin \phi,$$

where A' and B' are generated based on the first digital value and the second digital value, $\phi$ denotes the corresponding distortion angle, and the first pre-distorted digital value and the second pre-distorted digital value are calculated based on $A_{PRE-DIST}$ and $B_{PRE-DIST}$.

* * * * *